United States Patent
Burton et al.

(10) Patent No.: US 10,155,593 B2
(45) Date of Patent: Dec. 18, 2018

(54) ANTI-ICING, DE-ICING, AND HEATING CONFIGURATION, INTEGRATION, AND POWER METHODS FOR AIRCRAFT, AERODYNAMIC, AND COMPLEX SURFACES

(75) Inventors: Brett R. Burton, Columbus, OH (US); Ioan I. Feier, Columbus, OH (US); Timothy J. Lastrapes, Powell, OH (US)

(73) Assignee: Battelle Memorial Institute, Columbus, OH (US)

( * ) Notice: Subject to any disclaimer, the term of this patent is extended or adjusted under 35 U.S.C. 154(b) by 613 days.

(21) Appl. No.: 13/977,016

(22) PCT Filed: Jan. 3, 2012

(86) PCT No.: PCT/US2012/000009
§ 371 (c)(1),
(2), (4) Date: Nov. 21, 2013

(87) PCT Pub. No.: WO2012/092623
PCT Pub. Date: Jul. 5, 2012

(65) Prior Publication Data
US 2014/0070054 A1    Mar. 13, 2014

Related U.S. Application Data

(60) Provisional application No. 61/429,106, filed on Dec. 31, 2010.

(51) Int. Cl.
*B64D 15/12* (2006.01)
*H05B 1/02* (2006.01)
(Continued)

(52) U.S. Cl.
CPC ........... *B64D 15/12* (2013.01); *H05B 1/0236* (2013.01); *H05B 3/26* (2013.01); *H05B 6/10* (2013.01);
(Continued)

(58) Field of Classification Search
CPC ........ B64D 15/12; B64D 15/14; B64D 45/02; H05B 2214/02; H05B 2214/04
See application file for complete search history.

(56) References Cited

U.S. PATENT DOCUMENTS 2,992,317 A * 7/1961 Hoffman ................ B64D 15/12
219/202
4,875,644 A * 10/1989 Adams ................ B64D 15/163
244/134 D
(Continued)

FOREIGN PATENT DOCUMENTS

DE    10 2006 048 920    5/2008
EP    0 459 216    4/1991
(Continued)

OTHER PUBLICATIONS

Invitation from the International Searching Authority dated Jan. 27, 2014.
(Continued)

*Primary Examiner* — Brian M O'Hara
*Assistant Examiner* — Christopher D Hutchens
(74) *Attorney, Agent, or Firm* — Frank Rosenberg; C. Michael Gegenheimer

(57) ABSTRACT

Anti-icing methods and aerodynamic structures having laminated resistive heaters for de-icing are described. Several of the inventive aspects utilize laminated resistive heaters comprising a carbon nanotube layer and/or capacitors to store and supply electricity. The invention also
(Continued)

includes methods of making aerodynamic structures having de-icing or anti-icing functionality.

17 Claims, 8 Drawing Sheets

(51) Int. Cl.
  *H05B 3/26* (2006.01)
  *H05B 6/10* (2006.01)
(52) U.S. Cl.
  CPC .. *H05B 2203/007* (2013.01); *H05B 2203/013* (2013.01); *H05B 2214/02* (2013.01); *H05B 2214/04* (2013.01)

(56) References Cited

U.S. PATENT DOCUMENTS

| | | | |
|---|---|---|---|
| 5,925,275 A | 7/1999 | Lawson et al. | |
| 6,054,692 A * | 4/2000 | Hitomi | E01C 11/265 219/469 |
| 6,194,685 B1 * | 2/2001 | Rutherford | B64D 15/14 219/201 |
| 6,330,986 B1 | 12/2001 | Rutherford et al. | |
| 6,683,783 B1 | 1/2004 | Smalley et al. | |
| 7,148,619 B2 * | 12/2006 | Den | B82Y 30/00 313/310 |
| 7,302,145 B2 * | 11/2007 | Huston | H01B 7/288 385/100 |
| 8,662,452 B2 * | 3/2014 | Hallander | B64D 15/12 219/202 |
| 8,664,573 B2 * | 3/2014 | Shah | B64D 15/12 219/482 |
| 8,931,740 B2 * | 1/2015 | Nordin | B64C 3/20 244/134 D |
| 2003/0155467 A1 * | 8/2003 | Petrenko | A63C 1/30 244/134 R |
| 2004/0149734 A1 | 8/2004 | Petrenko et al. | |
| 2004/0245395 A1 * | 12/2004 | Wallace | B64D 15/12 244/134 R |
| 2005/0062024 A1 * | 3/2005 | Bessette | B82Y 30/00 252/500 |
| 2005/0191493 A1 * | 9/2005 | Glatkowski | B82Y 10/00 428/408 |
| 2008/0142238 A1 * | 6/2008 | Rawlings | B64D 45/02 174/2 |
| 2008/0223842 A1 | 9/2008 | Petrenko et al. | |
| 2009/0314765 A1 * | 12/2009 | Feng | H05B 3/145 219/520 |
| 2010/0213189 A1 | 8/2010 | Keite-Telgenbuescher et al. | |
| 2011/0024408 A1 * | 2/2011 | Wei | H05B 3/84 219/260 |
| 2011/0024409 A1 * | 2/2011 | Shah | B64D 15/12 219/482 |
| 2011/0116849 A1 * | 5/2011 | Qi | G03G 15/2057 399/333 |
| 2012/0082806 A1 * | 4/2012 | Kissell | C09D 5/24 428/34.1 |
| 2012/0207525 A1 * | 8/2012 | Kim | C09K 5/14 399/335 |
| 2013/0075386 A1 * | 3/2013 | Chang | H05B 3/22 219/538 |
| 2014/0124495 A1 * | 5/2014 | Feng | H05B 3/86 219/203 |

FOREIGN PATENT DOCUMENTS

| | | |
|---|---|---|
| WO | 2010129234 | 11/2010 |
| WO | 2010132858 | 11/2010 |

OTHER PUBLICATIONS

Hu, L. et al., "Percolation in Transparent and Conducting Carbon Nanotube Networks", Nano Letters, 2004, vol. 4, No. 12, 2513-2517.

M.E. Itkis et al., "Purity Evaluation of As-Prepared Single-Walled Carbon Nanotube Soot by Use of Solution-Phase Near-IR Spectroscopy", Nano Letters, 2003, vol. 3, No. 3, 309-314.

International Search Report and Written Opinion of the International Searching Authority issued in International Application No. PCT/US2012/000009 dated Jul. 30, 2014.

International Preliminary Examination Report on Patentability dated Aug. 5, 2014 in International Application No. PCT/US2012/000009.

Petrenko, Victor F., et al. "Pulse electro-thermal de-icer (PETD)", Cold Regions Science and Technology 65 (2011) 70-78.

* cited by examiner

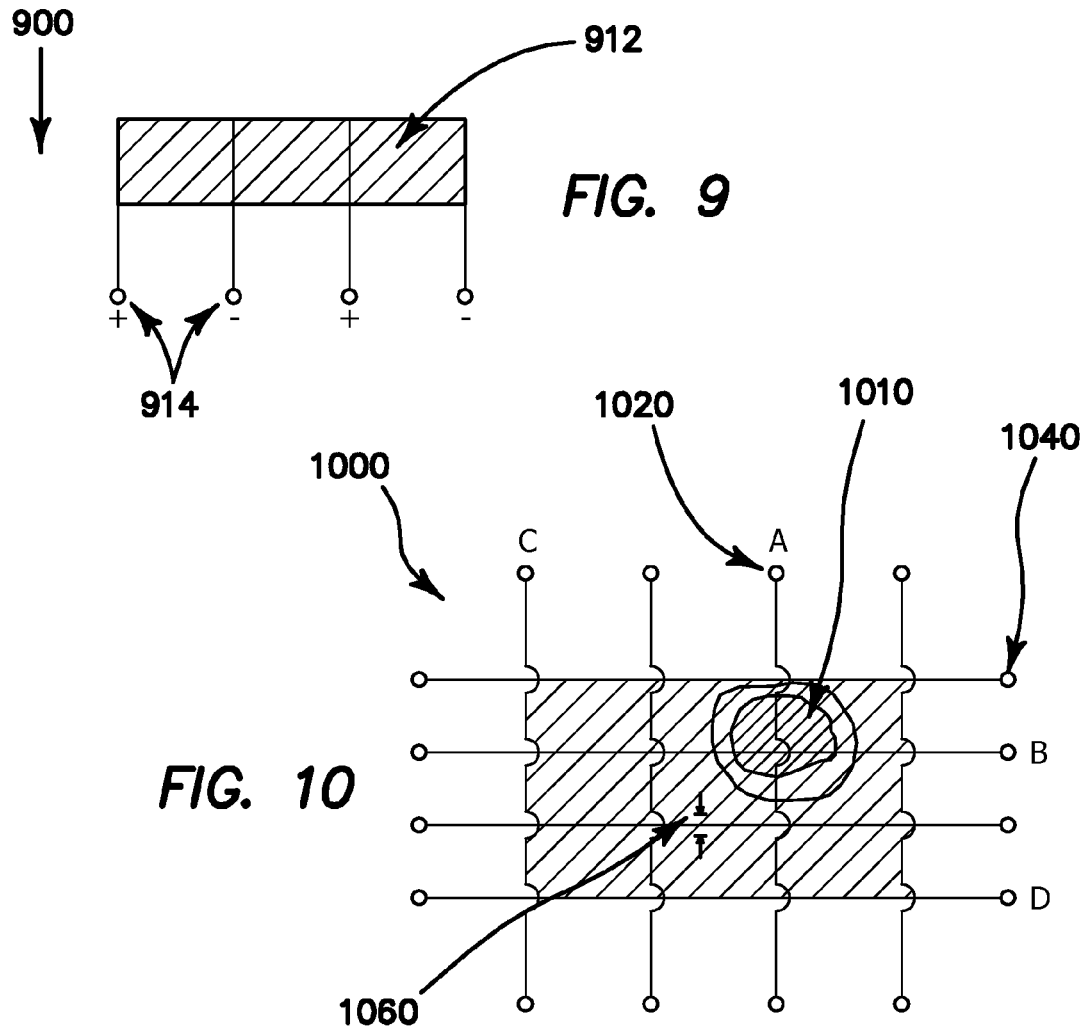
FIG. 9
FIG. 10
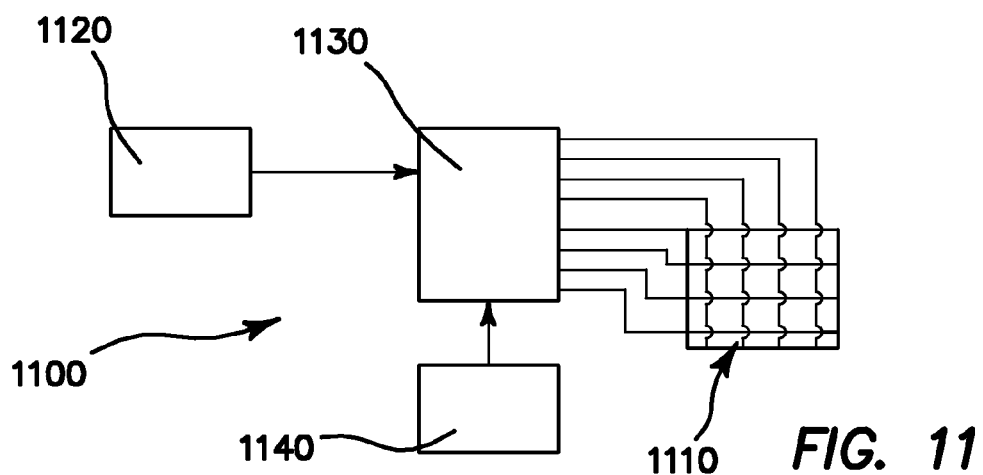
FIG. 11

ANTI-ICING, DE-ICING, AND HEATING CONFIGURATION, INTEGRATION, AND POWER METHODS FOR AIRCRAFT, AERODYNAMIC, AND COMPLEX SURFACES

RELATED APPLICATIONS

This application is a national stage filing and claims the priority benefit of PCT/US2012/000009 filed Jan. 3, 2012 and also claims the benefit of priority U.S. Provisional Patent Application Ser. No. 61/429,106, filed 31 Dec. 2010.

ABSTRACT

Anti-icing methods and aerodynamic structures having laminated resistive heaters for de-icing are described. Several of the inventive aspects utilize laminated resistive heaters comprising a carbon nanotube layer and/or capacitors to store and supply electricity. The invention also includes methods of making aerodynamic structures having de-icing or anti-icing functionality.

INTRODUCTION

Forward facing aerodynamic surfaces, for example, wind turbines, propeller spinners, radomes, when exposed to atmospheric icing conditions are susceptible to ice build-up on the leading edge surface. If not removed, this accumulated ice can add excessive weight to the structure and alter the airfoil configuration. For aircraft airfoils, this can cause undesirable and/or dangerous flying performance. Ice build-up on the outside surface of a radome causes undesirable attenuation and distortion of the transmitted electromagnetic waves.

The patent literature describes numerous attempts for preventing or removing ice from aerodynamic surfaces. For example, Petrenko et al. in U.S. Patent Application 2004/0149734 describe a system for ice prevention and removal with applications for airfoils etc. In one aspect an electrode grid system is described having a plurality of first electrode wires and second electrode wires separated by a grid spacing in a range of about 0.05 mm to 20 mm. The electrode wires coated with an insulating layer that separates the wires electrically. A high-frequency electric field in accordance with the invention typically has a field strength in a range of about from 100 V/cm to 100 kV/cm and a frequency not less than 100 Hz. An alternating electric field is applied to the ice to generate a resistive AC having a frequency greater than 1000 Hz in interfacial ice at interface. An AC power source provides a voltage of about 10 to 500 volts across the electrodes to create the alternating electric field. A portion of the capacitive AC associated with the alternating electric field is present in the interfacial ice as conductivity (resistive) AC, which causes dielectric loss heating.

Gafford et al. in U.S. Pat. No. 5,528,249 describe an anti-ice radome having a frequency selective surface and a plurality of resistive heating elements. The frequency selective surface prevents the resistive heating elements from disturbing the electromagnetic waves generated by an antenna within the radome, and therefore ice formation on the radome can be prevented without sacrificing the transmission characteristics of the radome. Slotted conductive elements are formed using conventional printed circuit board fabrication techniques to achieve the necessary precision.

A major concern with traditional leading edge heating systems is the problem when the melt water re-freezes as it flows backwards outside of the front heated panel. Typically after the ice melts along the leading edge, the melt water flows aft of the heated surface where it freezes, resulting in what is commonly known as runback ice. Rutherford et al. in U.S. Pat. No. 6,330,986 describe an electrothermal zoned de-icing system for an aircraft employing a heat-conducting tape bonded to the leading edge of an aircraft structure. The heat-conducting tape has a spanwise parting strip area, and first and second ice accumulation and shedding zones. The tape comprises a non-metallic electrical and heat conducting layer consisting of a flexible expanded graphite foil laminated to an outer heat-conducting layer, in which the thickness of the flexible expanded graphite foil layer in the parting strip area is always greater than the thickness of the foil layer in either of the ice accumulation and shedding zones. The parting strip area thus has a decreased electrical resistance, a greater flow of current, and becomes hotter than the zones in which the foil layer is thinner. Because the flexible expanded graphite foil is a monolithic structure that may be shaped, sculptured or layered to form different thicknesses in different areas, only a single control mechanism for a single set of electric terminals is necessary to produce desired temperatures in the parting strip and ice accumulation and shedding zones. When a predetermined amount of electric current is transmitted continuously through the tape, the outer surface of the heat-conducting outer layer at the parting strip is heated continuously to a temperature above 32° F. to maintain a continuous ice-free (running wet) condition. At intermittent intervals, an increased electric current is applied to the tape to raise the temperature of the outer surface of the heat-conducting outer layer at the spanwise ice accumulation and shedding zones above 32° F. to melt or loosen accumulated runback ice. The runback ice is then aerodynamically removed from the structural member by the airstream passing over the aircraft or by centrifugal forces when the aircraft structure is a propeller or rotor blade.

Resistive heating systems that can be applied to surfaces are known. For example, Shah et al. in WIPO Patent Application WO/2010/129234 describe a resistive heating system constructed from to a composite structure that includes a matrix material and a carbon nanotube (CNT)-infused fiber material including a plurality of carbon nanotubes (CNTs) infused to a fiber material. The CNT-infused fiber material is disposed throughout a portion of the matrix material and the composite structure is adapted for application of a current through the CNT-infused fiber material to provide resistive heating of the matrix material to heat the composite structure.

Laminated resistive heaters are commercially available. For example, Thermo Heating Elements manufacture a Polymer Thick Film (PTF) heater using a polyester substrate in sheet or roll form. A polymeric, silver-based paste is first screen printed onto the polyester in the desired circuit pattern, and this sheet or roll is then oven dried to cure or "set" the element. The circuits are then die cut apart, and terminals are added for lead attachment. The open face circuit is then covered with a double-sided pressure sensitive adhesive (PSA) tape on a polyester substrate. One side of the PSA joins the top and bottom layers of the heater, while the other side of the PSA is used to apply the heater to the desired part to be heated. Eeonyx Corporation manufactures EeonTex™ resistive heating fabric. It may be used in warming blankets; all-weather boots; and in use for de-icing of aircraft wings at high altitude. A thermal electric heating product for anti-icing and de-icing the leading edges of aviation vehicles is known as Thermawing™. This systems comprises a graphite film which is adhesively bonded onto the surface of the wings. The installation is performed by the heater manufacturer in their facility.

The patent literature provides additional examples of resistive heaters in laminated devices. To cite one example, Lawson et al. in U.S. Pat. No. 5,925,275 describe an electrically conductive composite heating assembly. This invention relates to heater elements intended for use in applications requiring high reliability in harsh environments. The patent reports that such heaters may be suitable for ice protection systems on aerospace structures, windmill blades or other like structures Various combinations of laminated resistive heaters with a pressure sensitive adhesive are described in the patent literature. For example, Keite-telgenbuescher et al. describe in US 2010/0213189 a resistive heater comprising a pressure sensitive adhesive layer where the resistive heating layer comprises a polymer layer that may contain carbon nanotubes as a filler. The polymer layer comprises more than 50 weight % polymer. Suggested applications for the laminated resistive heater include wing deicing and wall heaters.

Bessette et al. in US 2005/0062024 describe imparting conductivity using carbon nanotubes to pressure sensitive adhesive for various applications including aerospace. The inventors describe a process for manufacturing commercial quantities of tape by compounding in a conventional mixing apparatus an admixture of a PSA composition, carbon nanotubes, any additional fillers and/or additives, and a solvent or diluent. The formulation may be coated or otherwise applied to a side of a backing layer in a conventional manner. After coating, the resultant film may be dried to remove the solvent or otherwise cured or cooled to develop an adherent film on the backing layer. As a result of the inherent tack of the PSA film, an adhesive and/or mechanical bond may be developed between layers to form the integral, laminate tape. Alternatively, the adhesive layer may be separately formed and laminated under conditions of elevated temperature and/or pressure to the backing layer in a separate operation.

Feng et al. in US 2009/0314765 A1 describe a heater element comprising a substantially polymer-free carbon nanotube coating on a substrate. In one embodiment, a heater includes a planar support, heat-reflecting layer, a heating element, a first electrode, a second electrode, and a protecting layer.

Despite these efforts and other work, there remains a need for new systems having better ice removal performance, longer life and decreased weight and energy requirements.

SUMMARY OF THE INVENTION

In one aspect, the invention provides a method for an anti-icing, de-icing, and/or a heating system for aircraft wings and forward facing aerodynamic surfaces, comprising a first heated section near the central stagnation zone of the aerodynamic surface, and at least one upper and one lower heater section in areas aft of the central heater, wherein power supplied to the central heated section is continuously applied, and wherein power supplied to the at least one upper and one lower heater section is intermittently applied from charge stored in a capacitor. In preferred embodiments, the heater sections comprise CNT-containing resistive heaters. Preferably, the temperature of the first heated section is permanently maintained above 32° F. (0° C.). In the preferred mode of operation, the heating of the first heated section prevents cupped or shelled icing from forming there. In some methods, the at least one upper and lower heater section in areas aft of the central heater shed runback icing after the formation of an ice sheet.

As with all the methods described herein, the invention also includes an airfoil comprising the components corresponding to the above method.

In another aspect, the invention provides a method of storing charge in an airfoil, comprising: providing a capacitor comprising a CNT resistive heater layer, a layer comprising a carbon composite or metal surface, and a dielectric layer disposed between the CNT resistive layer and the carbon composite or metal surface; wherein the carbon composite or metal surface forms a structural component of the airfoil; and applying a potential between the CNT resistive layer and the carbon composite or metal surface. In some preferred embodiments, the carbon composite or metal surface comprises a wing, preferably wing made of a composite material; preferably a carbon composite. The invention also provides a corresponding device comprising the above-described components arranged as described herein. In some preferred embodiments, charge from the capacitor is used to power a CNT resistive heater layer to heat a portion of the exterior of the airfoil to remove ice or prevent ice formation.

The inventive aspects that employ a capacitor to power a resistive heater can provide significant advantages in terms of energy efficiency (for example, utilizing excess energy) and reduced weight since it can reduce the need for batteries.

In a further aspect, the invention provides a method making an airfoil comprising insulated electrical leads for powering a CNT heater system wherein, channels are machined or molded into the airfoil surface, and pre-formed electrical insulators are installed into these channels, and electrical power leads are installed into the insulators and contacting the electric leads to a CNT heater layer. Preferably, the pre-formed electrical insulators are made from a flexible plastic such as polyethylene. In another preferred embodiment, the channel allows for the electrical leads to remain flush with the outer wing surface when installed so as not to disrupt the aerodynamic properties of the airfoil shape. Preferably, the pre-formed electrical insulator completely encases the electrical lead where it passes through the hole in the airfoil (typically an aircraft wing). Also, preferably, the pre-formed electrical insulator is open on top of the channel area allowing for the electrical leads to contact with the CNT heater layer along its length; in preferred embodiments, the electrical insulator is open for a continuous length of at least 3 cm (in some embodiments at least 10 cm), and the electrical lead is in direct contact with the CNT heater layer for the length of at least 3 cm. In some preferred embodiments, the electrical lead comprises a porous metal such as copper mesh or braided copper wires for superior contact with the CNT layer.

As mentioned before, the invention includes an airfoil comprising the features described herein. For example, an airfoil having a channel in the surface of the airfoil wherein the surface of the channel is coated with an electrical insulator and wherein an electrical lead is in the channel; wherein the electrical insulator electrically insulates the airfoil from the electrical lead; wherein the electrical insulator does not completely surround the electrical lead over the length of the channel on a surface of the airfoil; and wherein a CNT-containing resistive heating layer directly contacts the electrical lead in the channel.

The invention further provides a targeted resistive heater, comprising: a plurality of vertically oriented electrode terminals in electrical contact with a layer of conductive substrate, and a plurality of horizontally oriented electrode terminals in electrical contact with the conductive substrate forming an array of intersecting wires, wherein an electrical switching network allows selected areas of the array to be selectively heated. The invention includes a method of using this targeted resistive heater, comprising applying voltages at different terminals such that the location of the heating is localized.

In another aspect, the invention provides a method for powering a CNT heater layer by induction. In this method, inductive coils are positioned opposite each other on the inner and outer surfaces of an airfoil skin, at least one inductive coil is in electrical contact with the CNT heater layer on the outer surface of the airfoil skin, and wherein the other inductive coil is on the inner surface of the airfoil skin and is in electrical contact with an AC power supply, and wherein AC current is applied to the inner coil which generates a current in the outer coil that powers the CNT heater layer. Preferably, the inductive coil is in electrical contact with the CNT heater layer on the outer surface of the airfoil skin is a flattened coil protected with a plastic film; an example is an inductive coil printed onto a thin film. In some embodiments, the inductive coils are applied to the inner and outer surfaces of the wing by an adhesive. In a preferred embodiment, the airfoil is a wing and the inner coil is on the inside of the wing.

The invention also includes an airfoil having a CNT heater layer on the outer surface of the skin of the airfoil, comprising the components as in the above-described method. An advantage and feature of this aspect is that the airfoil skin can remain intact, there is no need to make openings in the airfoil skin for electrical connections to the resistive heating layer.

The invention also provides a method of using a CNT layer as both a resistive heater and as an antenna, wherein an antenna comprising or consisting of a CNT layer uses RF energy or additional electrical energy for heating. In some preferred embodiments, the heating is used to deice the surface of an airfoil.

The invention further provides a resistively loaded antenna having a varying resistance at differing points in the antenna. The antenna comprises a CNT layer having varying resistance at differing points in the antenna. The varying resistance can be obtained by changing thickness of the CNT layer as a function of location, or changing resistance such as by varying dopant concentration as a function of location. This allows tailored control of RF propagation characteristics. The antenna may be planar—with a flat layer on a flat substrate. Alternatively, a CNT layer could coat three dimensional antenna elements. As with all of the concepts described herein, the invention also includes the corresponding method of making the structure and methods of operating the antenna. The antenna can be a patch antenna feedline or patch antenna array. The patch antenna can be of any geometry including rectangular, circular, triangular, irregular, fractal or otherwise. The properties such as CNT layer thickness, resistance, and/or dopant concentration preferably varies by at least 5% (more preferably at least 10%, in some embodiments at least 20%) over the area or the length (either from one side to another or at any desired points along the length).

For each of the inventive aspects, it is important to understand that the invention includes the method (such as the method of deicing, or heating or storing charge, or sending or receiving RF), the method of making an article (such as making the wiring, making a flying vehicle that includes the inventive structure), the inventive structures, and articles of manufacture that include the inventive structure (such as an aircraft or component such as wing, nosecone, radome (for aircraft or stationary), or propeller.

BRIEF DESCRIPTION OF THE DRAWINGS

FIG. 9 schematically illustrates a state of the art resistive heating configuration.

FIG. 10 schematically illustrates a targeted heating grid schematic with vertical electrode terminals intersecting horizontal electrode terminals.

FIG. 11 schematically illustrates a grid type electrode array.

GLOSSARY OF TERMS

Figure 1:
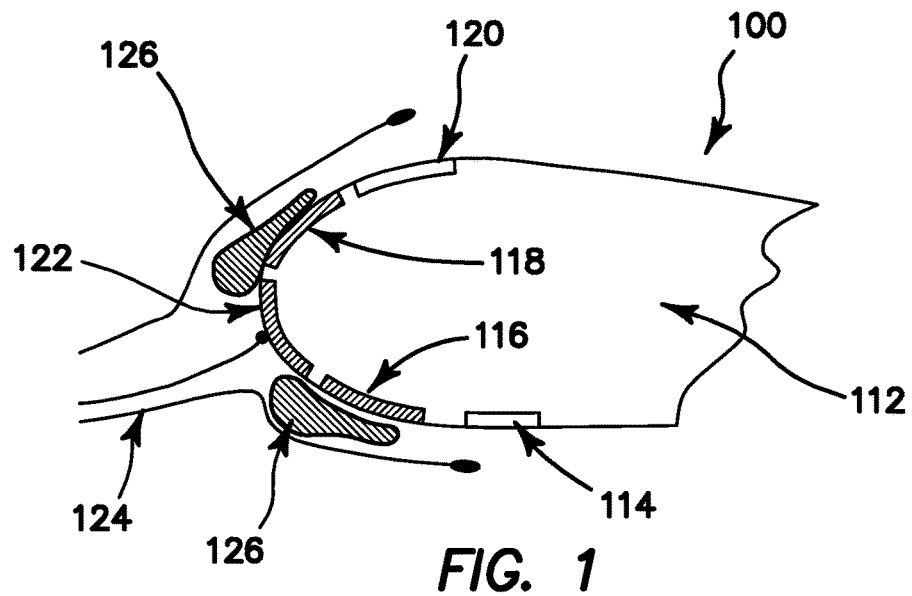
FIG. 1 shows a schematic of a cross-section of an aircraft wing with a central heater 122 at the stagnation zone, and upper and lower heaters.

An "aerodynamic surface" refers to a surface of an aircraft (such as an airplane or missile) over which a fluid flows. Most typically, an aerodynamic surface is a surface of a wing, blade, or nosecone.

An "airfoil" is a wing, fin, or blade. A wing skin typically has a thickness between 0.01 cm and 2 cm. Some preferred airfoil skins comprise carbon fiber and/or fiberglass composite materials.

The term "carbon nanotube" or "CNT" includes single, double and multiwall carbon nanotubes and, unless further specified, also includes bundles and other morphologies. The invention is not limited to specific types of CNTs. The CNTs can be any combination of these materials, for example, a CNT composition may include a mixture of single and multiwall CNTs, or it may consist essentially of DWNT and/or MWNT, or it may consist essentially of SWNT, etc. CNTs have an aspect ratio (length to diameter) of at least 50, preferably at least 100, and typically more than 1000. In some embodiments, a CNT network layer is continuous over a substrate; in some other embodiments, it is formed of rows of CNT networks separated by rows of polymer (such as CNTs deposited in a grooved polymer substrate).

"Dielectric" is a well known term that refers to an electrically insulating material that can be polarized in an electric field. Common dielectrics are ceramics and plastics.

A "patch antenna" is an antenna comprising a sheet of conductive material that has a thickness that is much smaller than both width and height; typically at least ten times smaller than either width or height. For purposes of the present invention, the conductive sheet comprises CNTs.

A "stagnation" zone is a volume where flow is relatively stagnant. This occurs most typically at the leading edge of a wing where ice can build up.

A "structural component" of an airfoil means a component that supports the structure of the airfoil; it is not a component exclusively used in a capacitor but it also supports the mechanical integrity of the airfoil. A typical example is the metal, or more preferably, carbon composite, that makes up a surface of a wing.

The invention is often characterized by the term "comprising" which means "including." In narrower aspects, the term "comprising" may be replaced by the more restrictive terms "consisting essentially of" or "consisting of."

DETAILED DESCRIPTION OF THE INVENTION

One aspect of the invention provides a method for anti-icing, de-icing, and a heating system for aircraft wings and forward facing aerodynamic surfaces, for example, wind turbines, propeller spinners, aircraft radomes, and nosecones. The invention comprises a first heated section near the central stagnation zone to prevent cupped or shelled icing from forming there, and at least one upper and lower heater section in areas aft of the central heater. Typically, runoff melt-water from the central heater will refreeze together with other ice accumulation. By periodically activating the upper and lower heaters to melt or break-up the ice-to-surface interface, the accumulated ice will be removed by aerodynamic (or other) forces.

Figure 3:
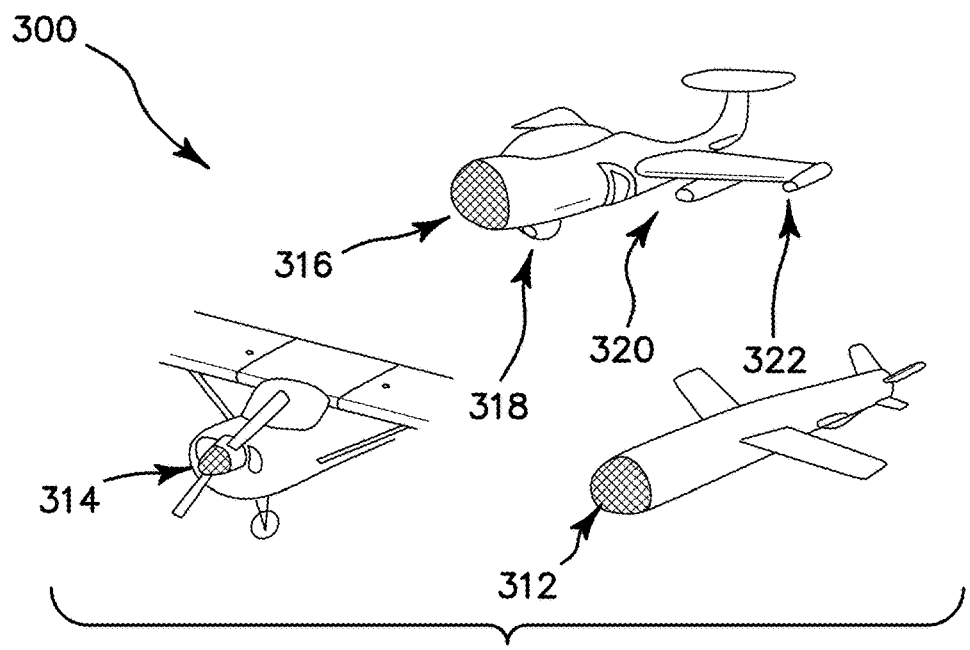
FIG. 3 schematically illustrates blunt shaped aerodynamic surfaces.
Figure 5:
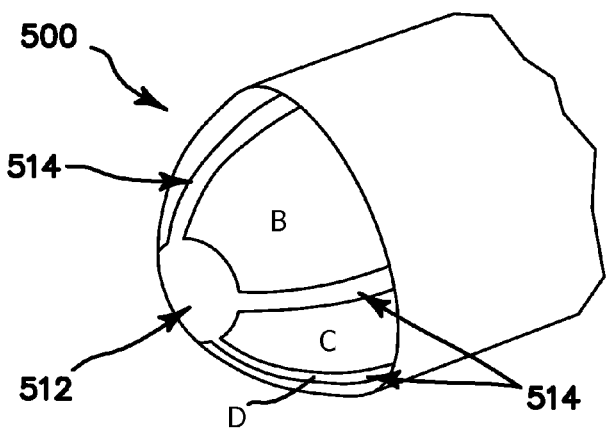
FIG. 5 schematically illustrates a missile nosecone with central heater and radial heating lines.
Figure 6:
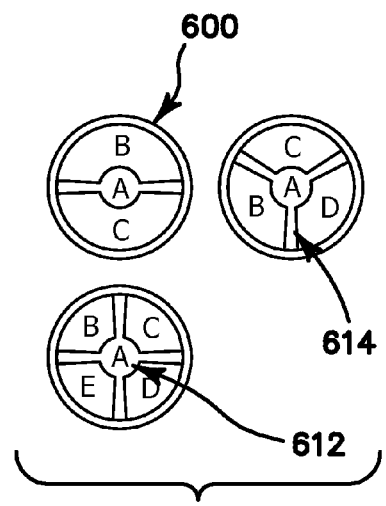
FIG. 6 schematically illustrates a surface 600 with 2, 3, or 4 radial heating lines 614 and a central heater 612.
Figure 7:
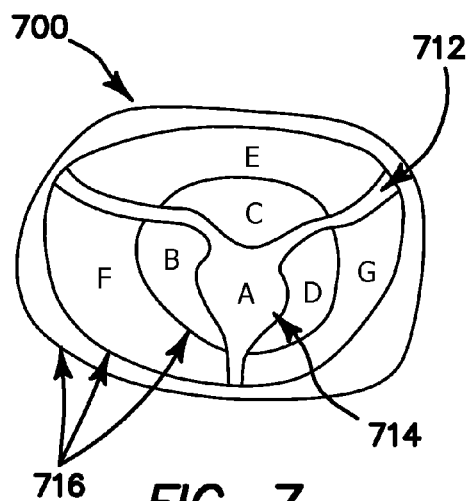
FIG. 7 schematically illustrates a surface with the curved heating lines extending from a central heating region FIG. 8 schematically illustrates an airplane nosecone with 3 radial heating lines and 3 heating panels.
Figure 8:
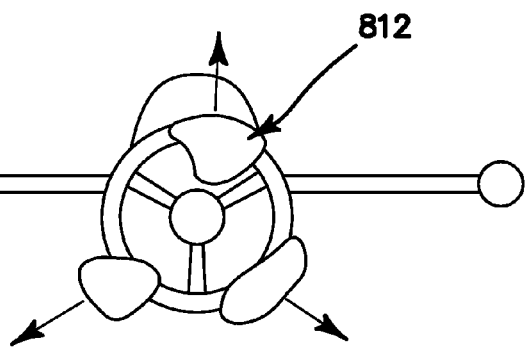

FIG. 1 shows a schematic 100 of a cross-section of an aircraft wing 112, central heater 122 at the stagnation zone, lower heaters 114 and 116, upper heaters 118 and 120, ice layer 126, and aerodynamic streamlines 124. As an alternative arrangement, FIG. 3 schematically illustrates applications 300 to blunt shaped aerodynamic surfaces such as propeller spinners 314, aircraft radomes 318, 320, 322, or nosecones 312, 316 (which may be radomes). For example, FIG. 5 illustrates a missile nosecone 500 with central heater 512 and radial heating lines 514, thus creating heating sections B, C, and D aft of the central heater 512. FIG. 6 illustrates a surface 600 with 2, 3, or 4 radial heating lines 614 and a central heater 612. FIG. 7 illustrates a surface 700 where the radial heating lines 712 extending from central heating region 714 may be curved. Intersecting heating lines 716 allow for complex heating zones to be formed. FIG. 8 illustrates an airplane nosecone 800 with 3 radial heating lines and 3 heating panels B, C and D. The accumulated ice 812 is removed after triggering heating zones B, C, and D.

A potential icing shell can be prevented from forming by heating radial zones outward from a region near the aerodynamic stagnation point. At least two radial heating lines would be needed but possibly three or more would function better. These would provide radial heating lines to break up icing shells into pieces that can be shed aerodynamically and/or due to centrifugal forces.

In operation, central heaters along the stagnation line or zone would be generally heated continuously, but alternatively may be heated intermittently. The heating areas aft of the stagnation line or zone, would generally be heated intermittently, but also could be heated continuously if desired. With this heating arrangement, the invention provides significant power consumption reduction (electrical in the case of electrothermal heaters, but could be engine power in case of engine bleed air), since all the supercooled impinging cloud droplets are not continuously heated—only those at the very leading edge near the stagnation zone.

Since the use of resistive heating panels with varying thicknesses can affect aerodynamics, in some preferred embodiments, the heating panels are equally thick; differential heating can be obtained by selectively heating each panel. In some embodiments, one or more ice sensors are used to monitor ice formation—thus, heating can be applied locally (to the desired panel(s)) and in the appropriate amount in response to ice formation or ice formation conditions. The central panel can be separated from the other panels by significant distances—for example the central panel and the upper panel can be separated by at least 1 cm, or at least 2 cm. Intermittently heating the upper panel enables removing ice in chunks, so that any ice in the gap between panels would be removed. Typically, any gap between panels would be filled by an insulating material—preferably the same polymer that overlies the CNTs.

Figure 2:
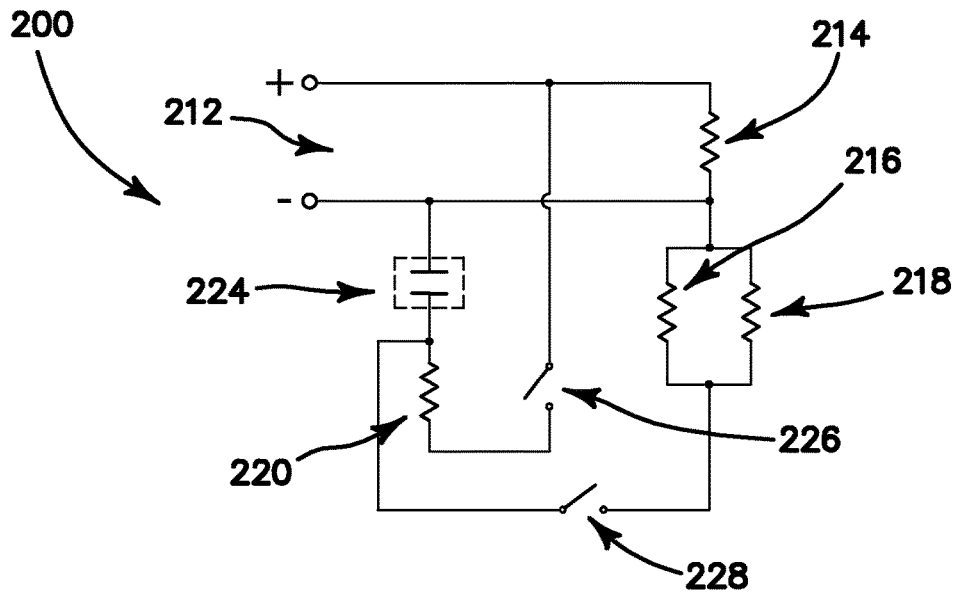
FIG. 2 schematically illustrates a heater circuit diagram incorporating terminals, a capacitor, switches, and resistive heating elements.

The resistive heaters (which may also be referred to as heating panels or resistive heating coatings (RHC) may be conventionally powered; more preferably, especially for intermittent heating, power is supplied to the resistive heaters from electrically connected capacitors. The intermittent heating could be powered by capacitors, and FIG. 2 shows a schematic 200 for a heater circuit diagram incorporating terminals 212, a capacitor 224, switches 226, 228, and resistive elements 214, 216, 218, and 220. The capacitor can include a CNT resistive heater.

Supercapacitors or ultracapacitors can be used as an electrical power source for the resistive heating elements in place of batteries. Compared to batteries, such capacitors are better for repeated cycling and quick charging/discharging and, if required, providing short duration high current pulses. The number and quantity of such capacitors depends on the overall design of the power system and the required operational duty of the resistive heaters in icing conditions. For example, if the onboard aircraft power for the anti icing system is small then the more capacitors that are used, the more energy that can be stored and subsequently delivered to the heating elements to increase temperature or duration. In some preferred embodiments, there are at least two such capacitors on each wing or aerodynamic surface; in some embodiments, at least 3; and in some embodiments, at least 6 such capacitors on each wing or aerodynamic surface.

Supercapacitors or ultracapacitors work very well in conjunction with the system that requires intermittent power to upper and lower resistive heaters. The capacitors can be powered (relatively slowly) from excess engine power, and then discharged (relatively quickly) to provide a pulse of power to a resistive heating panel. The invention can solve multiple problems. First it reduces the power requirement and/or need for batteries. Second it increases the available power density for the center heater. Third it can prevent runback icing, since the ice will collect in the areas over the upper and lower heaters because the stagnation heating area is small. Fourth, it can facilitate lower power usage by shedding ice in chunks, rather than trying to continuously keep all the impinging supercooled cloud droplets in liquid form (or evaporate them). It is a much smarter use of available power.

The invention provides a method that allows a CNT resistive heater to function as a capacitor due to the base dielectric gap to a substrate, comprising the CNT layer on top of a dielectric layer, on top of a carbon composite (or, less preferably, metallic) wing. Upper and lower intermittent heating zones are well suited to a cyclical capacitor power storage scheme. Lightweight and high power density super or ultra capacitors can be used to accumulate charge, which can then be pulsed to get a rapid heating of the upper and lower zones thereby shedding the accumulated ice from the impinged cloud droplets and the refrozen runoff from the center heater. The upper and lower heaters can be triggered from ultra or super capacitors due to their intermittent operation. In this fashion, the system can be applied to aircraft with low peak power availability.

Figure 4:
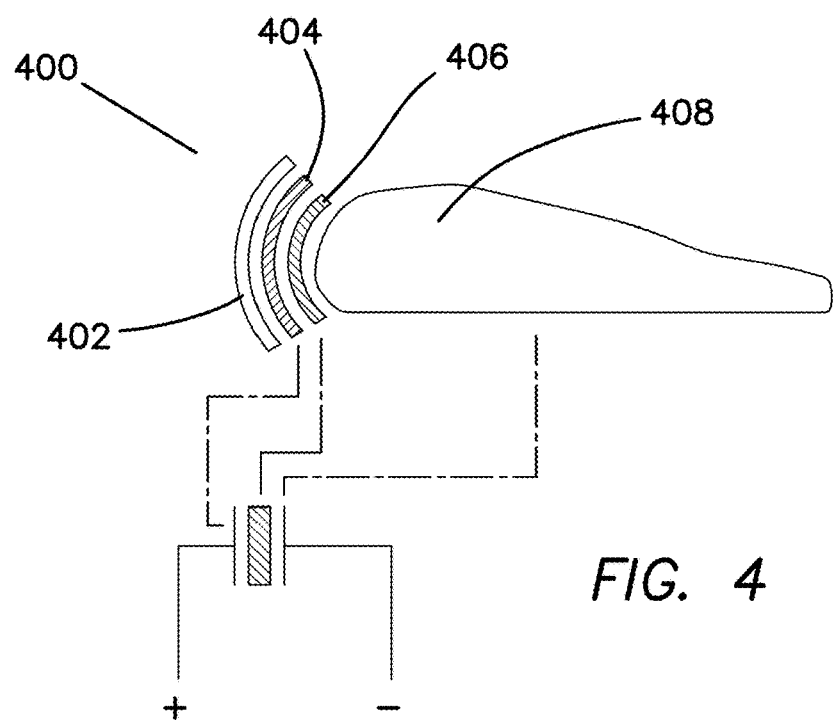
FIG. 4 schematically illustrates a capacitor that include a section of a wing.

The combination of the CNT layer and the conductive wing separated by an electrical insulating layer comprises the major elements of a capacitor. Therefore, the system layout allows it to also be used as a capacitor; in some embodiments using one charged resistive heating panel to power another panel for de-icing. FIG. 4 shows a schematic illustration 400 of the major components of this system. A wing section 408 forms one plate of the capacitor. A dielectric layer 406 separates the wing section from a CNT resistive heating element 404 that forms the second plate of the capacitor. A protective film 402, which is typically a polymer coating, protects the CNT layer.

Figure 16:
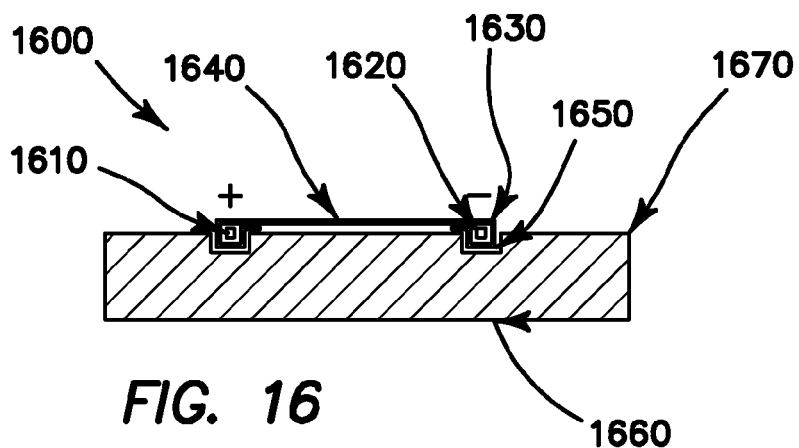
FIGS. 16-19 illustrate airfoils having insulated electrical leads integrated into the surface of the airfoil.
Figure 17:
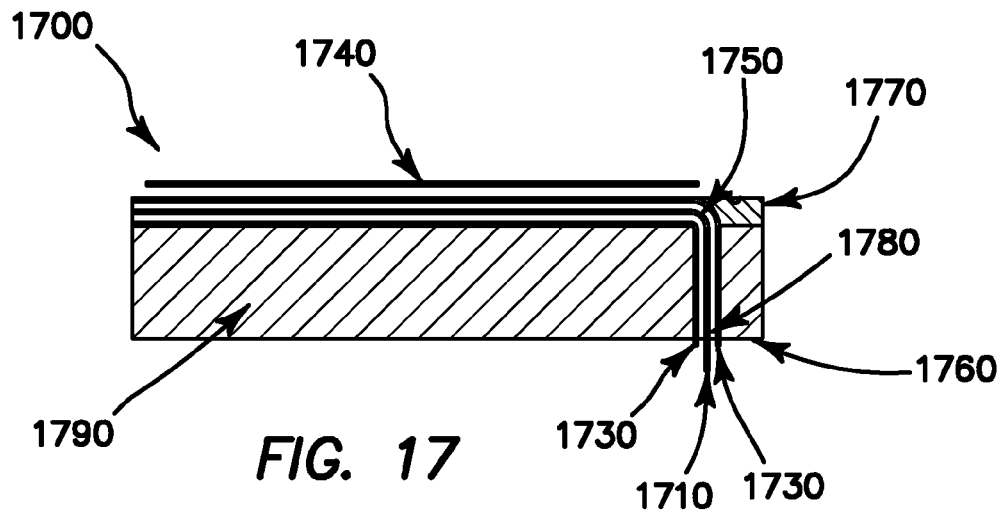
Figure 18:
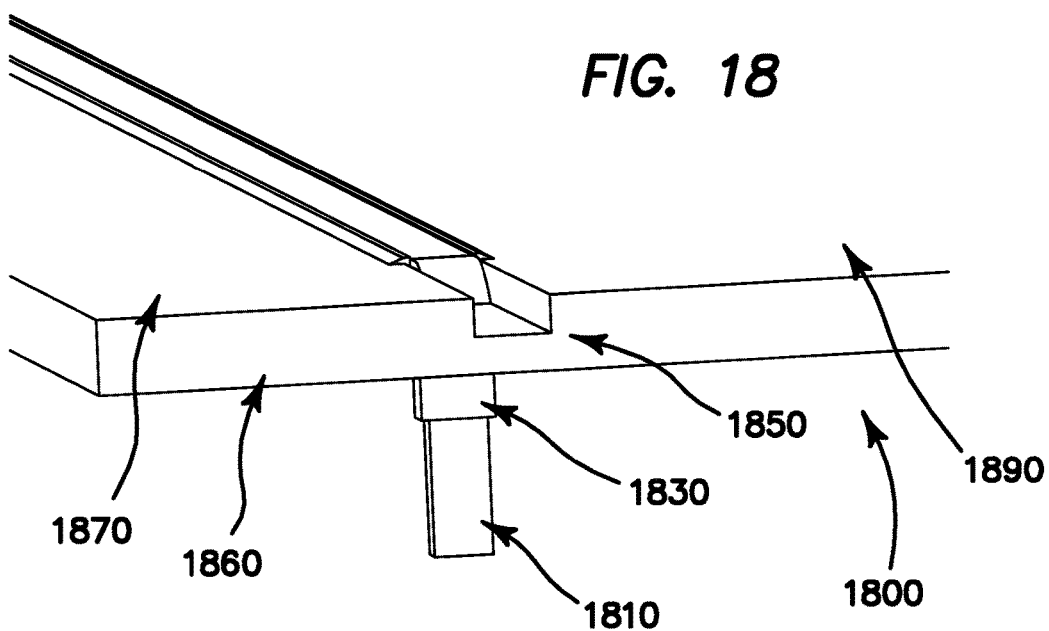
Figure 19:
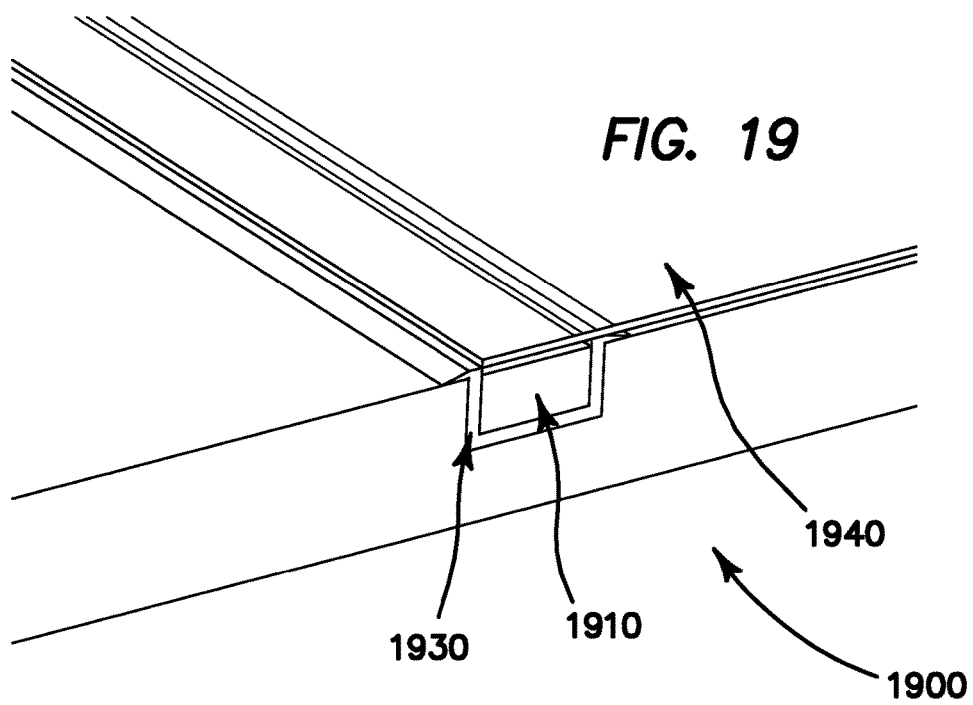

In some embodiments, electrical leads are used to power the resistive (preferably CNT-based) heater system. If these leads need to be passed through or be in contact with a conductive layer such as a carbon fiber wing skin, then the electrical leads must be thoroughly electrically insulated from the wing substrate. This insulation can be achieved by applying a primer coating, but coating thickness and uniformity can be difficult to control in order to ensure no pin-holes exist causing an electrical short. FIGS. 16-19 illustrate airfoils having insulated electrical leads integrated into the surface of the airfoil. FIG. 16 shows a schematic 1600 of a cross-section of an airplane wing, with two channels 1650 sunken into the wing 1670. Pre-formed electrical insulators 1630 are installed into the channels, and electrical power leads 1610 and 1620 are then installed into the insulators and electrical contact made with the CNT heater layer 1640. FIG. 17 schematically illustrates a different angle 1700 of FIG. 16. In FIG. 17 the electrical lead 1710, completely encased in insulator 1730, passes through a via 1780 in the wing 1790 and continues through channel 1750 at the outer surface of the wing. When the electrical lead reaches the CNT layer 1740, the pre-formed insulator only partially encases the electrical lead such that the electrical lead can make electrical contact with the CNT layer 1740. FIG. 18 presents another view 1800 of the same construction in which an electrical lead 1810, completely encased in insulator 1830, passes through a via in the wing 1890 and continues through channel 1850 at the outer surface of the wing. The cutaway view 1900 in FIG. 19 illustrates the connection of electrical lead 1910 to CNT layer 1940. The electrical lead is insulated from the wing by insulation 1930. An important aspect of this inventive concept is that the channels allow for the electrical leads to remain flush with the outer wing surface when installed so as not to disrupt the aerodynamic properties of the shape, see FIG. 19. The pre-formed insulator could be made from any electrically insulating material, but preferably from a flexible plastic such as polyethylene. The electrical lead is preferably completely encased as it passes from the interior of the airfoil through the skin 1860 to the exterior of the airfoil, then on the exterior of the airfoil the electrical lead preferably is open (on the exterior side only) along a length of the channel in order to contact the resistive heating layer; preferably the contact is for a length of at least 3 cm, in some embodiments at least 5 cm.

The wiring is preferably a porous or surface-roughened conductive material—this will provide superior contact to a CNT resistive heating sheet. Preferred types of wiring include copper mesh and flattened copper braids. It is believed that these conductors allow for capillary action to draw the CNT-fluid into intimate contact with the conductor improving the bond between carbon nanotubes and the electrode; especially with the CNT layer is formed from a coating mixture deposited onto the surface 1870 comprising the exposed electric lead 1710.

Figure 12:
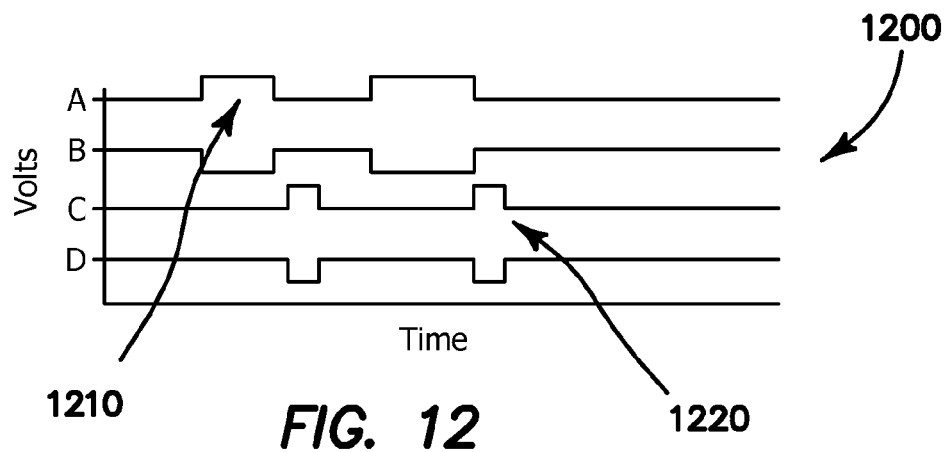
FIG. 12 schematically illustrates a voltage/time distribution chart to illustrate selectively applying potentials as a function of time.
Figure 13:
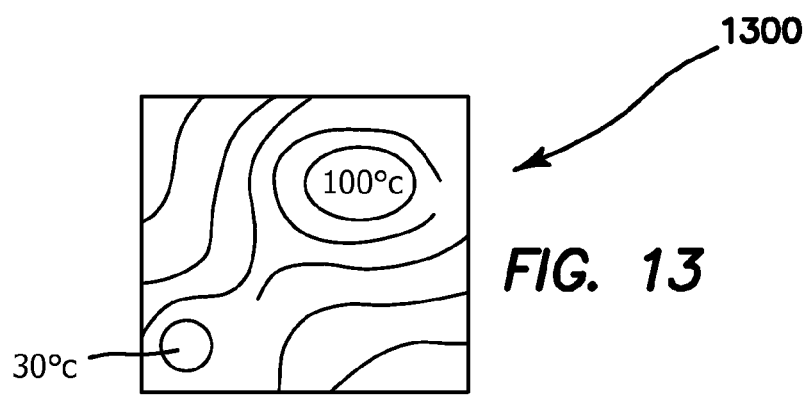
FIG. 13 schematically illustrates a temperature distribution profile on a patch antenna.

In yet another aspect, the invention provides a method for targeted heating areas of nearly unlimited shapes, comprising a grid type lead or electrode array wherein an electrical switching network allows different areas to be arbitrarily heated up at will by cycling power through the desired leads. FIG. 9 shows schematic 900 of a state of the art resistive heating layout with electrodes 914, and conductive layer 912. FIG. 10 illustrates a targeted heating grid schematic 1000, with vertical electrode terminals 1020 intersecting the horizontal electrode terminals 1040 and their associated power leads forming the array, not labeled. Either applied on top of, or sandwiched between the power lines, lies the resistive heater (preferably a CNT layer). A gap 1060 exists between the power lines allowing the vertical terminals 1020 and horizontal terminals 1040 to be powered independently without shorting. By having a grid of electrodes and applying voltages at different terminals, the location of the heating can be localized. Further by modulating the phase and or timing between different terminals, almost any heat distribution pattern can be generated on the array. FIG. 11 shows such a simple schematic 1100, with microcontroller 1120, switching network 1130, power supply 1140 and grid type lead or electrode array 1110. FIG. 12 illustrates schematic 1200 of a voltage/time distribution chart to illustrate selectively applying potentials as a function of time, and FIG. 13 illustrates schematic 1300 of an associated temperature distribution profile.

The grid pattern for the RHC system differs from LCD-TFT (or similar) based grids in that this concept focuses on controlling localized heating in a desired area. This allows for the application of the RHC system in bulk across an area, while only applying heat energy in the desired areas of the grid as needed.

Figure 15:
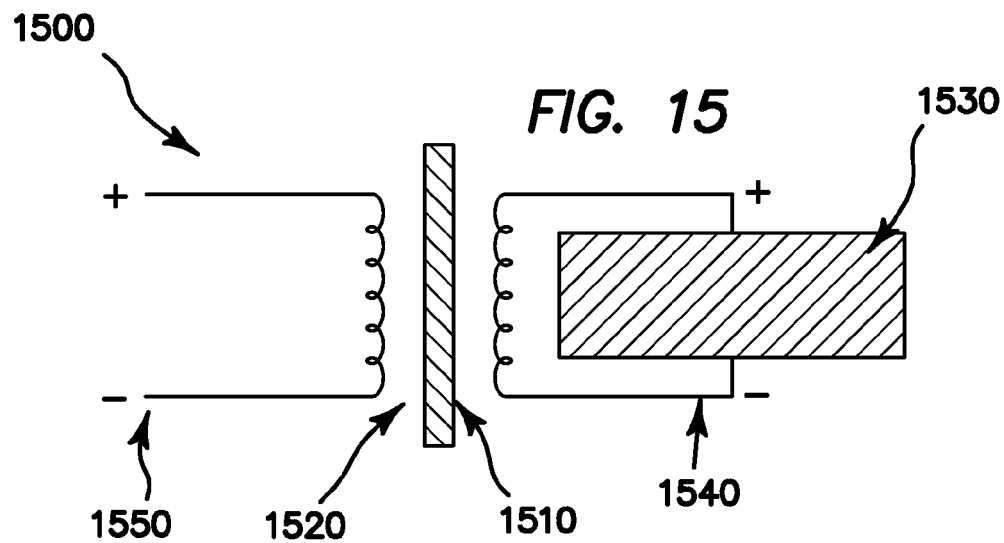
FIG. 15 schematically illustrates an inductively-powered CNT electrical circuit 1540 situated adjacent an outer wing surface 1510.
Figure 20:
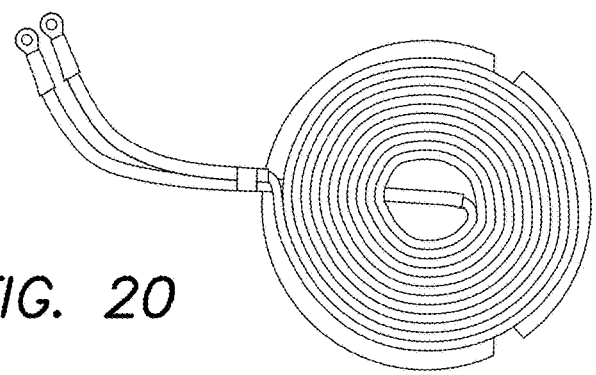
FIG. 20 shows a flat conductive coil encased in a polymer and electrical leads attached to the coil.

In another aspect the invention provides a method for powering the CNT heater layer through inductive means, and hence avoiding the need to drill holes through the airplane wing for example. The invention comprises attaching inductive coils to the inner and outer surfaces of the wing, wherein one of the inductive coils is in electrical contact with the CNT heater layer, and wherein the other inductive coil is in electrical contact with an AC power supply. In FIG. 15, schematic 1500 illustrates the inventive concept. AC power supply 1550 and electrical coil is situated adjacent the inner wing surface 1520, and the inductively-powered CNT electrical circuit 1540 is situated adjacent the outer wing surface 1510, thereby heating CNT layer 1530. The inductive coils may be printed onto thin films for example 3M aero laminate, and then applied to the inner and outer surfaces of the wing by an adhesive. AC power is required instead of DC power for this induction heating concept, but not to the detriment of the thermal performance of the CNT heater layer. Preferred coils comprise flattened coils in a layer of material such as a polymer. See FIG. 20 which shows the flat coil encased in a polymer and electrical leads that can be used to connect to a resistive heating element. In a preferred embodiment, one coil is inside a wing while a second coil is adjacent a heating panel on or near the outer surface (i.e., adjacent or near the atmosphere). Preferably, the coils are directly opposite each other. When powering the inside coil with AC power, an electromagnetic field is produced. This electromagnetic field then creates a current in the outer surface coil through induction even though the coils are separated by a gap. Together, this pair of coils create a transformer. The current from the outer coil is used to power a resistive heating element. The inner coil can be either flat or cylindrical; the outer coil is preferably flat to minimize any effects on the aerodynamic properties of the airfoil. The resulting structure may have fewer defects since the resistive heating element can be powered without drilling holes through the wing. The coils are preferably protected with a polymer coating and can be attached to the airfoil by an adhesive or other suitable means.

Figure 14:
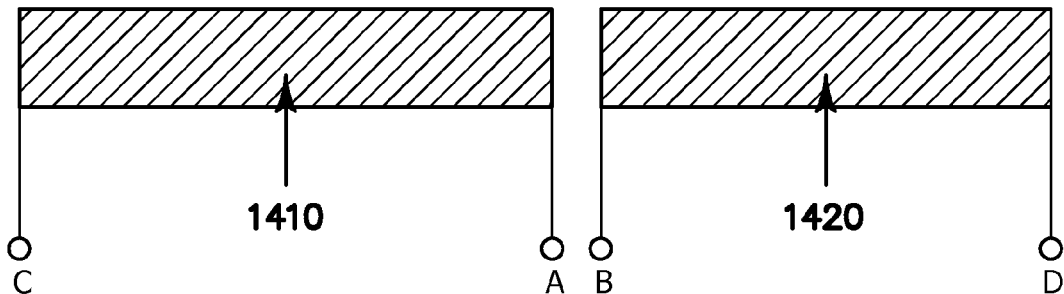
FIG. 14 schematically illustrates a configuration that allows a CNT layer to function as both a resistive heater and as an antenna.

In another aspect the invention provides a method that allows the CNT layer to function as both a resistive heater and as an antenna. In FIG. 14, when DC power is applied between electrode connections A&C and between electrode connections B&D an area of the resistive heater (e.g., the CNT layer) is heated. If, in FIG. 14, Radio Frequency (RF) is applied between electrode connections A&B an antenna affect is observed. The electromagnetic radiation may be controlled by fine tuning the material resistance of the CNT layer. Resistance in the antenna RF elements may be undesired, however one interesting effect is that the resistance changes with temperature, so heating the elements may allow some useful effect of active resistance control. Alternatively, the only electrical connection point for the dipole drawn in FIG. 14 may be points A&B where RF power is introduced. The resistive power dissipation of the CNT layer can transform some of the RF energy directly into the heating of the dipole elements.

Most antennas have high conductivity throughout their elements and control the radiation with their structure (dipoles, yagis, log-periodic, helicals, etc.). Although this can also be done with the proper shaping of the CNT area, the electromagnetic radiation can be controlled by fine tuning the material resistance of the CNT layer through composition, thickness, or geometry. High resistance in the antenna RF elements may be undesired, but some resistance is desired for thermal heating performance.

Figure 21:
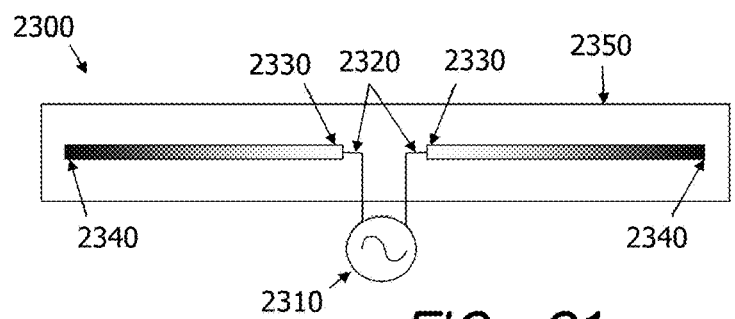
FIG. 21 schematically illustrates a dipole that can be created with a varying resistance.

Also, the CNT technology is ideally suited for creating resistively loaded antennas of various shapes because it can be printed, sprayed, etched or painted on substrates to obtain various shapes. Importantly the local resistance can be varied throughout the shape. Thus, a dipole can be created with a varying resistance from the drive point (feed line point where RF is introduced) to the outer tips of the dipole elements. FIG. 21 shows a schematic 2300 of the inventive concept as applied to a dipole. A CNT dipole from 2330 to 2340 can be deposited on a suitable inert substrate 2350. The CNT resistance can increase outward from 2330 to 2340 as indicated by progressively darker shading. An RF source 2310 provides energy through feedlines 2320 to the antenna drive point 2330. Only one such resistance variation of many possibilities is shown. Various distributions can be conceived to tune antenna propagation and impedance characteristics. Additionally the concept can be applied to patterned loop, bowtie, and multi-element shapes. Also the CNT layer can be used in a three dimensional way. For example, a dipole or yagi element can be made from some suitable inert rods and coated with a CNT layer at its surface to create a resistively loaded three dimensional structure.

Figure 22:
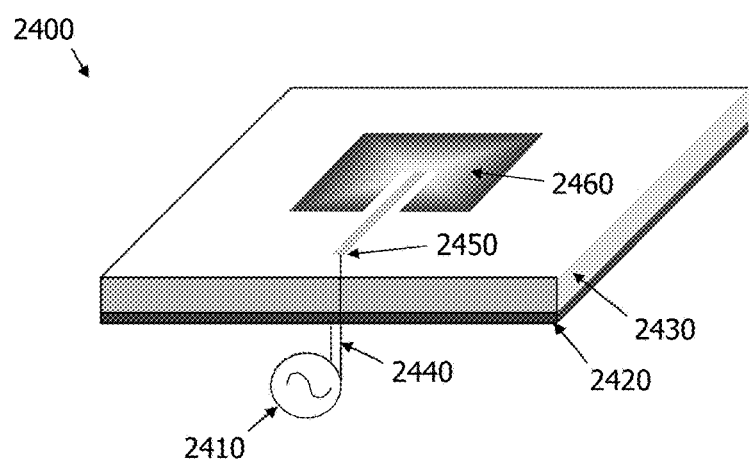
FIG. 22 schematically illustrates a microstrip patch antenna with increasing resistance toward the edges.

Another example is that the system can easily be used as a resistively loaded patch antenna due to its customizable geometry, i.e. a ground plane surface (airplane outer wing skin), dielectric layer (primer/laminate), and conductor (CNT layer). Again, this could allow the system to be heated while also using it as an antenna, but importantly, the ability to tailor the resistive loading throughout the element(s) can allow for tunable antenna properties which fixed resistance elements do not provide. FIG. 22 shows a schematic 2400 of the inventive concept as applied to a microstrip patch antenna 2460. The rectangular patch antenna is fed at the drive point 2450 via feedlines 2440 from the RF source 2410. A dielectric 2430 separates the patch element from the ground plane on the bottom 2420. Preferably, there is a varying resistance in the patch element 2460. The patch antenna is shown with shading from the center outwards to represent one possible distribution of CNT resistance with increasing resistance toward the edges. Other CNT resistance distributions are plausible (for example, increasing from one side to the other over any desired length or increasing over the entire length of the patch element in any direction) and can be used for tuning the antenna propagation characteristics (i.e. radiated field strength as a function of direction) for specific applications. Also the geometric shape need not be constrained to rectangular arrays, and this resistively loaded invention can be applied to all the other antenna patch shapes: such as circles, triangles, fractals, and other geometries.

Throughout this disclosure is mentioned a resistive heating layer or component, sometimes referred to as an RHC. In its broadest aspect, this can be any resistive heater; preferably, however, the resistive heating component is a Carbon Nanotube (CNT) based resistive heater which is believed to provide numerous advantages over other types of resistive heaters. Examples of CNT resistive heaters are disclosed in WO2010/132858, which is assigned to Battelle Memorial Institute.

The term "carbon nanotube" or "CNT" includes single, double and multiwall carbon nanotubes and, unless further specified, also includes bundles and other morphologies. The invention is not limited to specific types of CNTs. The CNTs can be any combination of these materials, for example, a CNT composition may include a mixture of single and multiwall CNTs, or it may consist essentially of DWNT and/or MWNT, or it may consist essentially of SWNT, etc. CNTs have an aspect ratio (length to diameter) of at least 50, preferably at least 100, and typically more than 1000.

A CNT network can be prepared, for example, as a dispersion of CNTs applied directly to a substrate where the solvents used in the dispersion process are evaporated off leaving a layer of CNTs that coagulate together into a continuous network. The CNT network may be prepared from dispersions and applied by coating methods known in the art, such as, but not limited to, spraying (air assisted airless, airless or air), roll-coating, gravure printing, flexography, brush applied and spin-coating. The thickness of the CNT layer is in the range from 0.005 µm to 100 µm, preferably in the range of 0.05 µm to 100 µm, more preferably in the range of 0.3 µm to 100 µm.

The CNT layer may include other optional additives such as p-dopants. P-dopants could include, but are not limited to, perfluorosulfonic acids, thionyl chloride, organic pi-acids, nitrobenzene, organometallic Lewis acids, organic Lewis acids, or Bronsted acids. Materials that function as both dispersing agents and dopants such as Nafion and hyaluronic acid may be present. These materials contain p-doping moieties, i.e. electron accepting groups, within their structure, often as pendant groups on a backbone. Generally, these additives will be present as less than 70% by weight of the CNT film, and in some embodiments as less than 50% by weight of the CNT film. Polymers and carbohydrates that function as both dispersing agents and dopants can be distinguished from other polymer materials, i.e. those functioning as only a dispersing agent or those functioning as a structural component. Because of the presence of electron accepting moieties, these materials can form a charge transfer complex with semiconducting CNTs, which p-dopes the semiconducting CNTs and raises the electrical conductivity. Thus, these dual dispersing agent/dopants can be tolerated at a higher mass percentage within the CNT layer than other types of polymer materials or surfactants.

The thickness of a coating composition over the CNT material is preferably 2 mm or less, more preferably 150 µm or less, preferably 50 µm or less, in some embodiments, a thickness of 250 nm to 50 µm; thicker layers can experience foaming or bubbling during application that leads to pathways for a subsequent topcoat to penetrate and disrupt the conductivity of the CNT layer.

A coating composition can be applied to the CNT network by known methods; for example, bar coating or spraying. Techniques, such as troweling, that disrupt the CNT network should be avoided. After application of a protective coating to the CNT network, the coated substrate can be cured (in some embodiments, curing is conducted at ambient temperature). In the curing operation, the film forming materials crosslink to leave a mechanically durable and chemically resistant film.

A multilayered laminate resistive heater could be manufactured with conventional roll coat equipment. The electronic leads could be printed on a base substrate, such as 3M's Aerospace quality protective film. The carbon nanotube dispersion can then be applied to the film printed with circuitry with conventional roll coating methods. The protective coating could also be applied in this manner in-line.

In some embodiments, the CNT is substantially polymer-free such that polymer (if present) does not significantly affect the electrical properties of the layer; preferably, the interior of the CNT layer contains 10 weight % polymer or less, more preferably 5 wt % or less, and still more preferably 2 wt % or less. In some embodiments, a pressure sensitive adhesive (PSA) is present on the major side of the substrate opposite the side over which the CNT layer is disposed. The PSA can be used to adhere the resistive heater to the outer surface of an airfoil.

A resistive heater laminate can be applied in the field since the substrate can be backed with a pressure sensitive adhesive (an adhesive that bonds to a substrate by the application of pressure) and a release layer. The release layer would be removed and the laminated heater applied to a substrate like a sticker. A more permanent installation of a laminate heater can be applied with a structural adhesive such as epoxy instead of a pressure sensitive adhesive.

The aqueous or non-aqueous solvent present in common aerospace top coats, when applied to a CNT material, may disrupt the electrical properties of the CNT material by several mechanisms. One mechanism is by increasing the electrical resistance between adjacent CNTs. Topcoats dissolved in solvents can infiltrate the CNTs, permitting the topcoat resin system to permeate and cure between the individual CNT fibers. The CNTs require intimate contact to transport electrical charge from one CNT to another; charge transport takes place though either tunneling or hopping. If a non-conductive polymer resin remains between the CNTs, it prevents close contact of CNTs, which increases the energy associated with electron hopping or tunneling, and behaves as a high resistance resistor in series. The effect is that the bulk conductivity of the CNT material is reduced significantly. Treatment of CNTs with surfactants or dispersing agents is often used to improve their interaction with water or solvents. After film formation; these surfactants and dispersing agents often remain in the film, continuing to modify the surface properties of the CNTs. This renders the CNT layer more susceptible to penetration by aqueous or non-aqueous solvents. To avoid this problem, in some preferred embodiments, a solvent-free protective layer can be used to prevent the change in resistance that accompanies the application of either organic-solvent-based or water-based coatings to CNT materials. In some preferred embodiments, a polyurethane coating is in direct contact with the CNT layer.

In some preferred embodiments, the substrate is an airplane or part of an airplane such as a wing. The geometric surface area (that is, the area that can be measured by a ruler rather than BET surface area) of the coated article is preferably at least 0.5 cm×0.5 cm, more preferably at least 1 cm×1 cm, in some embodiments at least 5 cm×5 cm.

The polymer protective coating provides sufficient chemical resistance so as to prevent solvents (including water), or other environmental hazards from subsequently applied coatings or solvents from penetrating the polymer and disrupting the CNT network or changing its conductivity significantly.

Prior to coating with a polymer or polymer precursor composition (to form the protective coating), a CNT network layer is preferably in the form of a CNT/air composite, for example a CNT network film, a paper or cloth-like layer of CNTs, or a macroscopic fiber of CNTs. CNT network layers of the present invention preferably contain at least 25 weight % CNT, in some embodiments at least 50 wt %, and in some embodiments 25 to 100 wt % CNT. The CNTs can be distinguished from other carbonaceous impurities using methods known to those skilled in the art, including NIR spectroscopy ("Purity Evaluation of As-Prepared Single-Walled Carbon Nanotube Soot by Use of Solution-Phase Near-IR Spectroscopy," M. E. Itkis, D. E. Perea, S. Niyogi, S. M. Rickard, M. A. Hamon, H. Hu, B. Zhao, and R. C. Haddon, Nano Lett. 2003, 3(3), 309) Raman, thermogravimetric analysis, or electron microscopy (Measurement Issues in Single Wall Carbon Nanotubes. NIST Special Publication 960-19). The CNT network layer (again, prior to coating) preferably has little or no polymer ("polymer" does not include CNTs or carbonaceous materials that typically accompany CNTs—typical examples of polymers include polyurethane, polycarbonate, polyethylene, etc.); preferably the network layer comprises less than 5 wt % polymer, more preferably less than 1 wt %) The volume fraction in the network layer is preferably at least 2% CNTs, more preferably at least 5%, and in some embodiments 2 to about 90%. The remainder of the composite may comprise air (by volume) and/or other materials such as residual surfactant, carbonaceous materials, or dispersing agent (by weight and/or volume). "Substantially without polymer" means 5 weight % or less of polymer in the interior of a CNT film, preferably the film has 2 weight % or less of polymer, and still more preferably 1 weight % or less of polymer in the interior of the CNT film. This is quite different from composite materials in which CNTs are dispersed in a polymer matrix.

After the CNT network layer has been coated, it retains electrical conductivity provided by contacts between CNTs; it is preferably not a dispersion of CNTs in a polymer matrix. Typically, a cross-sectional view of the composite material will show a polymer layer that contains little or preferably no CNTs and a CNT network layer that comprises CNTs (and possibly other carbonaceous materials that commonly accompany CNTs, as well as surfactants) with little or no polymer. Preferably, a CNT network layer that has an overlying polymer coating comprises 50 mass % or less of the coating polymer within the CNT layer, more preferably 25 mass % or less, and still more preferably 10 mass % or less of the coating polymer within the layer. Preferably, a CNT layer comprises at least 25 mass % CNTs and carbonaceous materials, and preferably at least 50 mass % CNTs and in some embodiments 30 to 100 mass % CNTs. CNT networks and CNT fibers have very distinct rope-like morphology as observed by high resolution SEM or TEM. See for example Hu, L.; Hecht, D. S.; and Gruner, G. *Nano Lett.*, 4 (12), 2513-2517 for CNT networks and U.S. Pat. No. 6,683,783 for images of CNT fibers. Because the CNT layers typically contain little or no polymer, they exhibit surface roughness, if characterized by AFM, associated with the CNT diameter and bundle size, in the range of 0.5 to 50 nm. Preferably, the coating composition contacts the surface of the CNT network layer but does not fill spaces within the network layer. Penetration of a coating into the CNT layer could also be determined by cross-section of the multi-layer sample and then analysis by methods such as SEM-EDS or XPS; the CNT layer is preferably substantially free from N-groups that are associated with the topcoat.

CNT layers have many contacts between CNTs and good conductivity that is, a resistivity less than 0.05 $\Omega\cdot cm$, preferably less than 0.002 $\Omega\cdot cm$. The sheet resistance of this layer should be less than 500 $\Omega$/square, preferably less than 200 $\Omega$/square, more preferably less than 50 $\Omega$/square. The CNT layer may be planar, cylindrical, or other contiguous geometry; in some preferred embodiments, the CNT layer is substantially planar (similar to a sheet of paper or a non-woven textile sheet, a few fibers may project from a planar layer). These are preferred characteristics of the CNT layer both before and after a coating is applied over the CNT layer.

In some embodiments, solventless, preferably 100% solids, (free of organic and water solvent) suitable isocyanate compound or mixture of compounds can be used as the curing agent to form the protective layer. To function as an effective crosslinking agent, the isocyanate should have at least two reactive isocyanate groups. Suitable polyisocyanate crosslinking agents may contain aliphatically, cycloaliphatically, araliphatically and/or aromatically bound isocyanate groups. Mixtures of polyisocyanates are also suitable. Polyisocyanate containing aliphatically, cycloaliphatically, araliphatically and/or aromatically bound polyisocyanate groups are also suitable. This includes, for example: hexamethylene trimethylhexamethylene diisocycante, meta-$\alpha,\alpha,\alpha',\alpha'$-tetramethylxylylenediisocyanate, 1-isocyanato-3,3,5-trimethyl-5-isocyanatomethyl cyclohexane (isophoronoe diisocyanate or "IPDI"), bis(4-isocyanatocyclohexyl)methane (hydrogenate MDI), toluene diisocyanate ("TDI"), hexamethylene diisocyanate ("HDI") or biuret derivatives of various diisocyanates.

In addition to the components discussed above, other additives can also be incorporated such as cure catalysts. Cure catalysts for isocyanate are well known to those skilled in the art such as organometallic catalysts and, particularly, organotin compounds such as dibutyltin diacetate, dibutyltin dioxide, bibutyltin dilaurate and the like. Other optional ingredients such as surfactants, defoamers, thixotropic agents, anti-gassing agents, flow control agents, pigments, fillers, and other additives without added organic or water solvents may be included in the composition. In preferred embodiments, the polymer precursor composition comprises at least 90 mass %, more preferably at least 95 mass % (in some embodiments at least 98 mass %) of components that, after curing, are bonded to the polymer structure.

The thickness of the coating composition over the CNT material is preferably 2 mm or less, more preferably 150 $\mu$m or less, preferably 50 $\mu$m or less, in some embodiments, a thickness of 250 nm to 50 $\mu$m.

A coating composition can be applied to the CNT network by known methods; for example, bar coating or spraying. Techniques, such as troweling, that disrupt the CNT network should be avoided; although troweling might be used in the case where a grooved substrate protects the CNTs. After application of a protective coating to the CNT network, the coated substrate can be cured (in some embodiments, curing is conducted at ambient temperature). In the curing operation, the film forming materials crosslink to leave a mechanically durable and chemically resistant film.

The sheet resistance of the CNT layer before coating may be determined by standard 4-point probe methods or other known methods for determining sheet resistance. The impact of the subsequent coatings on the sheet resistance of the underlying material may be determined by one of several methods, depending on the applications of interest. Metallic leads, such as silver painted leads, may be applied under or over the CNT layer and the resistance measured. Subsequent overcoats may then be applied on top of the CNT layer and the resistance re-examined. Application of the coating of this invention should result in less than 81% change in resistance, preferably less than 10% change in resistance, and still more preferably less than 5% change in resistance, after curing the coating. Likewise, application of subsequent layers on top of this stack should not increase the resistance by more than 5%, preferably by 3% or less. Alternatively, one could measure the shielding effectiveness of a CNT film before and after application of coatings, using a method such as SAE ARP-1705. Application of the coating of this invention should result in less than 38% change in shielding effectiveness, more preferably less than 5% after curing the coating. Likewise, application of subsequent layers on top of this stack (that is, the CNT network layer and the protective coating) should not decrease the shielding effectiveness by more than 5%.

What is claimed:

1. An airfoil, comprising: a channel in a surface of the airfoil wherein a surface of the channel is coated with an electrical insulator and an electrical lead is disposed in the channel;

wherein the electrical insulator electrically insulates the airfoil from the electrical lead; wherein the electrical insulator does not completely surround the electrical lead over the length of the channel;

wherein the electrical insulator is open on top of the channel area allowing for the electrical lead to contact a CNT-containing resistive heating layer, and wherein the CNT-containing resistive heating layer contacts the electrical lead in the channel; and further comprising a second electrical lead in electrical contact with the CNT-containing resistive heating layer; wherein the CNT-containing resistive heating layer is disposed between the electrical leads and wherein, during operation, the electrical leads power the CNT-containing resistive heating layer.

2. The airfoil of claim 1 wherein the airfoil is a wing and wherein the electrical leads pass through a via in the skin of the wing and wherein the electrical leads are completely encased in the electrical insulator through the via that passes through the skin and connects to the channel.

3. The airfoil of claim 1 where the electrical insulator is made from a flexible plastic.

4. The airfoil of claim 1 wherein the channel allows for the electrical leads to remain flush with the surface when installed so as not to disrupt the aerodynamic properties of the airfoil.

5. The airfoil of claim 1 wherein the electrical insulator completely encases the electrical leads where they pass through a hole in the wing.

6. The airfoil of claim 1 wherein the electrical leads are porous which allows for capillary action to draw a CNT-fluid into contact with the lead improving the bond between carbon nanotubes and the electrical leads.

7. The airfoil of claim 1 where the electrical insulator is open on top of the channel area allowing for the electrical leads to contact with the CNT heater layer along a length of at least 10 cm.

8. The airfoil of claim 6 wherein the electrical leads comprise copper mesh or braided copper wires.

9. The airfoil of claim 1 further comprising a coating disposed over the CNT heating layer; wherein the coating has a thickness of 2 mm or less.

10. The airfoil of claim 2 wherein the CNT-containing resistive heating layer comprises at least 25 weight percent CNTs.

11. The airfoil of claim 2 wherein the CNT-containing resistive heating layer comprises 5 weight percent or less of a polymer.

12. The airfoil of claim 1 wherein the CNT-containing resistive heating layer has a thickness in the range of 0.05 µm to 100 µm.

13. The airfoil of claim 12 wherein the CNT-containing resistive heating layer has a sheet resistance of less than 500 Ω/square.

14. The airfoil of claim 1 wherein the channel is a first channel recessed in the surface of the airfoil; and further comprising a second channel recessed in the surface of the airfoil wherein the surface of the second channel is coated with a second electrical insulator and the second electrical lead is disposed in the second channel;

wherein the second electrical insulator electrically insulates the airfoil from the second electrical lead; wherein the second electrical insulator does not completely surround the second electrical lead over the length of the second channel; and wherein the CNT-containing resistive heating layer extends between an exposed surface of the first electrical lead in the first channel and an exposed surface of the second electrical lead in the second channel.

15. The airfoil of claim 14 wherein the first channel and the second channel each have rectangular cross-sections perpendicular to the channel length.

16. The airfoil of claim 15 comprising a polymer coating overlying the CNT heater layer and wherein the CNT-containing resistive heating layer comprises 10 mass % or less of the coating polymer.

17. The airfoil of claim 15 wherein the electrical leads have a rectangular cross-section and wherein the electrical insulator surrounds the electrical lead on three sides and is open on one side where they contact the CNT-containing resistive heating layer.

* * * * *